United States Patent
Nagatsu et al.

(10) Patent No.: US 10,354,846 B2
(45) Date of Patent: *Jul. 16, 2019

(54) SPUTTERING TARGET-BACKING PLATE ASSEMBLY

(71) Applicant: JX Nippon Mining & Metals Corporation, Tokyo (JP)

(72) Inventors: Kotaro Nagatsu, Ibaraki (JP); Shinichiro Senda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/785,083

(22) PCT Filed: Oct. 29, 2014

(86) PCT No.: PCT/JP2014/078757
§ 371 (c)(1),
(2) Date: Oct. 16, 2015

(87) PCT Pub. No.: WO2015/068625
PCT Pub. Date: May 14, 2015

(65) Prior Publication Data
US 2016/0086777 A1 Mar. 24, 2016

(30) Foreign Application Priority Data
Nov. 6, 2013 (JP) .................. 2013-230344

(51) Int. Cl.
*H01J 37/34* (2006.01)
*C23C 14/34* (2006.01)
(Continued)

(52) U.S. Cl.
CPC ............ *H01J 37/3429* (2013.01); *C22C 9/04* (2013.01); *C22C 18/02* (2013.01);
(Continued)

(58) Field of Classification Search
CPC .............. H01J 37/3426; H01J 37/3417; H01J 37/3435; H01J 37/3429; C23C 14/3414; C23C 14/3407; C22C 9/04; C22C 18/02
See application file for complete search history.

(56) References Cited

U.S. PATENT DOCUMENTS 5,693,203 A 12/1997 Ohhashi et al.
6,759,143 B2 * 7/2004 Oda .................... C23C 14/3407
204/298.13
(Continued)

FOREIGN PATENT DOCUMENTS

DE 2455163 A * 5/1975
EP 0881311 A1 5/1998
(Continued)

OTHER PUBLICATIONS

Machine Translation JP2001329362A.*

*Primary Examiner* — Michael A Band
(74) *Attorney, Agent, or Firm* — Howson & Howson LLP

(57) ABSTRACT

The present invention is a sputtering target-backing plate assembly in which the sputtering target is made from Ta having a 02% proof stress of 150 to 200 MPa, and the backing plate is made from a Cu alloy having a 0.2% proof stress of 60 to 200 MPa. The present invention aims to increase the uniformity of the film thickness as well as increase the deposition rate and improve the productivity by reducing, as much as possible, the plastic deformation of the sputtering target caused by the repeated thermal expansion and contraction of the sputtering target-backing plate assembly as a bimetal.

6 Claims, 2 Drawing Sheets

Generation process of warping (when the expansion coefficient of the BP is high)

Concave depression is generated when the expansion coefficient of the BP is high Convex warping is generated as a result of being pulled by the contraction of the BP

(51) Int. Cl.
*C22C 18/02* (2006.01)
*C22C 9/04* (2006.01)
*C23C 14/16* (2006.01)

(52) U.S. Cl.
CPC ...... *C23C 14/3407* (2013.01); *C23C 14/3414* (2013.01); *H01J 37/3417* (2013.01); *H01J 37/3426* (2013.01); *H01J 37/3435* (2013.01); *C23C 14/16* (2013.01)

(56) References Cited

U.S. PATENT DOCUMENTS

| | | | |
|---|---|---|---|
| 6,793,124 | B1 | 9/2004 | Takahashi et al. |
| 7,347,353 | B2 | 3/2008 | Yamakoshi et al. |
| 8,020,748 | B2* | 9/2011 | Ivanov ................ B23K 20/122 228/112.1 |
| 8,157,973 | B2* | 4/2012 | Oda .................... C23C 14/3407 204/298.12 |
| 9,085,819 | B2 | 7/2015 | Senda et al. |
| 2003/0134143 | A1 | 7/2003 | Oda et al. |
| 2007/0051624 | A1 | 3/2007 | Okabe et al. |
| 2008/0271779 | A1* | 11/2008 | Miller .................. B22F 1/0014 136/252 |
| 2009/0277788 | A1* | 11/2009 | Oda .................... C23C 14/3407 204/298.13 |
| 2010/0261034 | A1* | 10/2010 | Cardarelli ............... A61L 27/42 428/615 |
| 2011/0266145 | A1 | 11/2011 | Fukushima et al. |
| 2012/0031756 | A1 | 2/2012 | Fukushima et al. |
| 2012/0037501 | A1 | 2/2012 | Fukushima et al. |
| 2012/0199469 | A1* | 8/2012 | Rasheed ................. C22C 19/03 204/192.1 |
| 2013/0098759 | A1 | 4/2013 | Senda et al. |
| 2013/0161188 | A1 | 6/2013 | Linsbod |
| 2014/0242401 | A1 | 8/2014 | Senda et al. |
| 2015/0064056 | A1 | 3/2015 | Nagatsu et al. |
| 2015/0197848 | A1 | 7/2015 | Suzuki et al. |

FOREIGN PATENT DOCUMENTS

| | | | | |
|---|---|---|---|---|
| GB | 1478162 | A * | 6/1977 | ........... C22C 1/0425 |
| JP | H11-236665 | A | 8/1999 | |
| JP | 2001-329362 | A | 11/2001 | |
| JP | 2007-084928 | A | 4/2007 | |
| JP | 2009242895 | A * | 10/2009 | |
| WO | 2015/002253 | A1 | 1/2015 | |

* cited by examiner

SPUTTERING TARGET-BACKING PLATE ASSEMBLY

BACKGROUND

The present invention relates to a sputtering target-backing plate assembly comprising characteristics that are required in magnetron sputtering.

Conventionally, the sputtering method capable of easily controlling the film thickness and components has been broadly used as one type of deposition method of materials for electronic/electric components. Moreover, in order to increase the sputtering deposition rate, a magnetron sputtering device, which controls the plasma based on electromagnetic force, has been broadly used in particular. Moreover, while the power input to the sputtering target is being increased as much as possible in order to increase the deposition rate, in the foregoing case, the sputtering target is heated from the collision of positive ions with the target surface, and the temperature of the target tends to increase together with the increase of the input power.

Normally, a sputtering target is bonded with a backing plate that is prepared from a material having favorable thermal conductivity such as copper, and this backing plate is configured to be cooled via means such as water-cooling so as to indirectly cool the sputtering target that is heated as described above. Since the backing plate is recycled in many cases, the sputtering target and the backing plate are often bonded with a brazing material or adhesive so as to enable the replacement of the sputtering target.

Generally speaking, a magnet in the magnetron sputtering device adopts a structure of being rotated in a cooling device. In this kind of device, an eddy current is generated when the magnet is rotated in the cooling device, and the eddy current increases together with the increase in the speed of rotation. In addition, a reverse magnetic field is generated due to the eddy current, and the generated reverse magnetic field functions to reduce the equivalent magnetic flux. The reduction of the equivalent magnetic flux consequently affects the uniformity of the film significantly, and there is a problem in that the deposition rate will fluctuate.

Conventional technologies are introduced below.

Patent Document 1 discloses a copper or copper alloy target-copper alloy backing plate assembly for use in magnetron sputtering, wherein the copper alloy backing plate is made from a beryllium copper alloy or a Cu—Ni—Si alloy.

Moreover, Patent Document 2 describes an assembly obtained by bonding a sputtering target made from copper, aluminum, tantalum or the like, and a backing plate made from a copper alloy or an aluminum alloy having a specific resistance value of 3.0 μΩ·cm or more, and a tensile strength of 150 MPa or more.

Patent Document 3 discloses an assembly configured by bonding a backing plate for sputtering made from a Cu alloy having a 0.2% proof stress of 200 MPa or more, and a sputtering target. Moreover, Patent Document 4 describes an assembly configured by bonding a backing plate for sputtering made from an Al alloy having a 0.2% proof stress of 200 MPa or more, and a sputtering target.

Patent Document 5 discloses an assembly configured by diffusion-bonding the target and the backing plate via an insert material made from aluminum or an aluminum alloy and in which the deformation after diffusion bonding is small even when the difference in the thermal expansion rate between the target and the backing plate is great. Moreover, Patent Document 6 describes a sputtering target-backing plate assembly having a structure in which pure copper is embedded in the backing plate position at the center of the target and which yields superior strength and eddy current characteristics.

Nevertheless, the conventional sputtering target-backing plate assemblies faced the following problems. In other words, since the sputtering target becomes heated in accordance with the input power (sputtering power), the heating and cooling of the target is repeated when the sputtering source is turned ON and OFF. Thus, the sputtering target-backing plate assembly is subject to plastic deformation as a result of repeating the deformation caused by the thermal expansion and contraction as a bimetal as shown in FIG. 1. In addition, this kind of deformation of the target caused the problems of inducing changes in the uniformity of the film thickness and the deposition rate, coming into contact with the magnet and so on.

PRIOR ART DOCUMENTS

Patent Documents

[Patent Document 1] Japanese Patent No. 4331727
[Patent Document 2] Japanese Patent Application Publication No. 2001-329362
[Patent Document 3] Japanese Patent Application Publication No. H11-236665
[Patent Document 4] Japanese Patent Application Publication No. H10-330929
[Patent Document 5] International Publication No. WO2010134417
[Patent Document 6] International Publication No. WO2011018970

SUMMARY

An object of the present invention is to provide a sputtering target-backing plate assembly capable of increasing the uniformity of the film thickness as well as increasing the deposition rate and improving the productivity by reducing, as much as possible, the plastic deformation of the sputtering target caused by the repeated thermal expansion and contraction of the sputtering target-backing plate assembly as a bimetal.

As a result of intensive studies to resolve the foregoing problems, the present inventors discovered that, by appropriately selecting materials having a predetermined 0.2% proof stress as the sputtering target and the backing plate, it is possible to inhibit the plastic deformation of the sputtering target based on the repetition of thermal expansion and contraction even when the difference in the thermal expansion coefficient between the sputtering target and the backing plate is great.

Based on the foregoing discovery, the present invention provides:
1) A sputtering target-backing plate assembly configured by bonding a sputtering target, and a backing plate having a thermal expansion rate that is greater than that of the sputtering target, wherein the sputtering target is made from Ta having a 0.2% proof stress of 150 to 200 MPa, and the backing plate is made from a Cu alloy having a 0.2% proof stress of 60 to 200 MPa;
2) The sputtering target-backing plate assembly according to 1) above, wherein the backing plate is made from a Cu alloy having a 0.2% proof stress of 100 to 150 MPa; and
3) The sputtering target-backing plate assembly according to 1) above, wherein the backing plate contains 30 to 40 at % of Zn, and remainder is Cu.

The sputtering target-backing plate assembly of the present invention yields a superior effect of being able to increase the uniformity of the film thickness as well as increase the deposition rate and improve the productivity by reducing, as much as possible, the plastic deformation of the sputtering target caused by the repeated thermal expansion and contraction of the sputtering target-backing plate assembly as a bimetal.

DETAILED DESCRIPTION OF DRAWINGS

DETAILED DESCRIPTION

Figure 1:
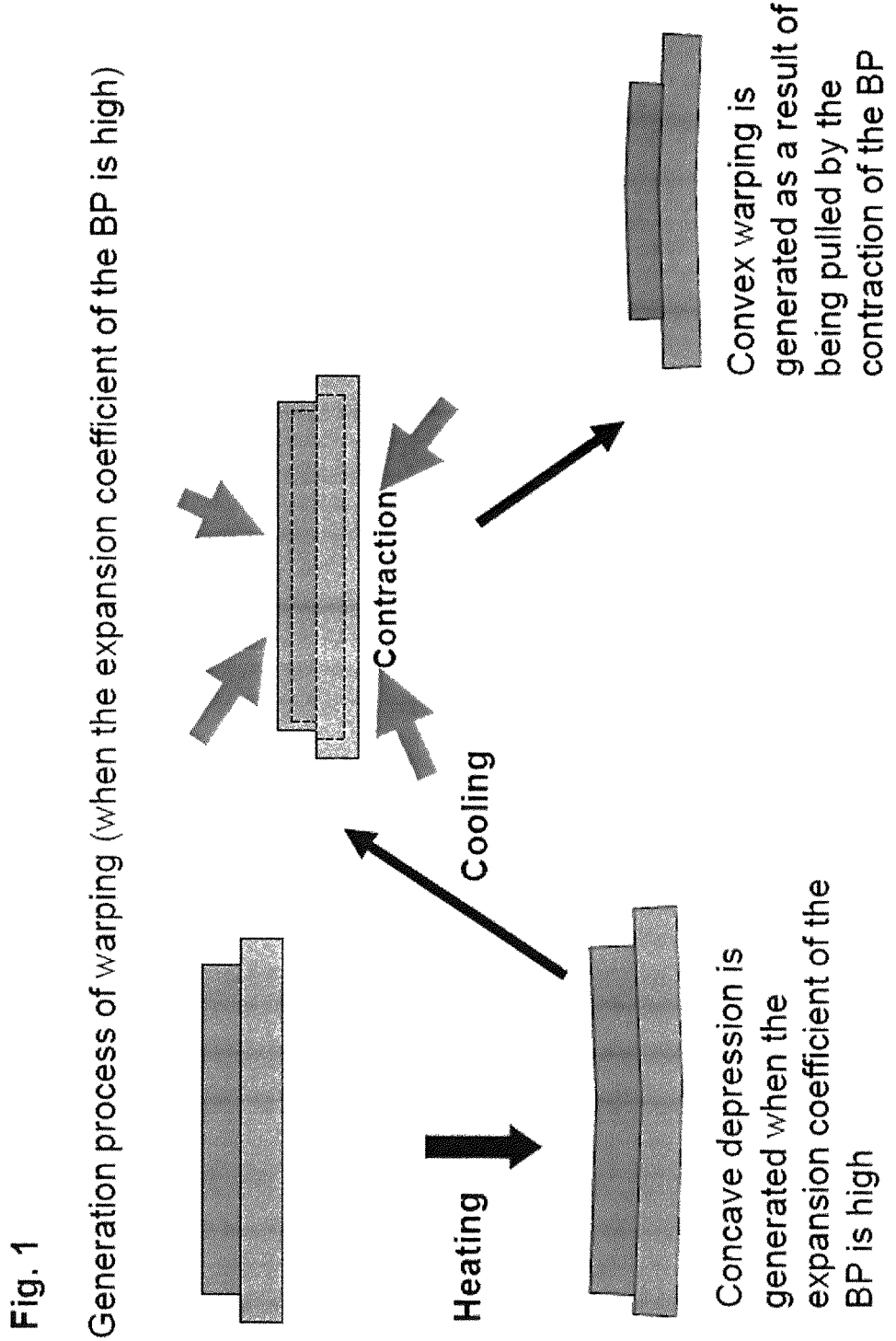
FIG. 1 is a schematic diagram showing the generation process of warping of the sputtering target.

Generally speaking, in a sputtering target that is bonded with a backing plate having a large thermal expansion rate (thermal expansion coefficient), when the proof stress of the backing plate is greater than the stress at the diffusion bonded interface during sputtering, a concave deformation is generated in the elastic deformation region on the sputtering surface-side of the backing plate during sputtering. Meanwhile, when the target is cooled after the completion of the sputtering process, the sputtering target is subject to plastic deformation and a convex warping is generated on the sputtering surface-side caused by contraction. Consequently, if the ON/OFF (starting and stopping the operation) is repeated, deformation of sputtering will gradually advance, and affect the uniformity of the film thickness and the deposition rate to deteriorate.

In order to resolve the foregoing problems, the present invention provides a sputtering target-backing plate assembly configured by diffusion-bonding a sputtering target made from Ta, and a backing plate made from a Cu alloy, wherein the sputtering target has a 0.2% proof stress of 150 to 200 MPa, and the backing plate has a 0.2% proof stress of 60 to 200 MPa.

The thermal expansion coefficient of Ta used as the sputtering target member is approximately 6.1 to 6.5 p/K in a range of 273 K to 373 K, and the thermal expansion coefficient of the Cu alloy used as the backing plate member is approximately 16.8 to 17.6 p/K in a range of 273 K to 373 K. However, even in cases where a sputtering target and a backing plate having considerably different thermal expansion rates are bonded, it is possible to effectively inhibit the plastic deformation of the target after sputtering, and reduce the in-plane variation of the sputtered film.

In the present invention, the 0.2% proof stress of the sputtering target (tantalum) is set to be 150 MPa to 200 MPa. When the 0.2% proof stress is less than 150 MPa, plastic deformation tends to occur during sputtering. Moreover, when the 0.2% proof stress exceeds 200 MPa, this is undesirable since production itself becomes difficult and costs will increase.

In the present invention, the 0.2% proof stress of the backing plate (copper alloy) is set to be 60 MPa to 200 MPa. When the 0.2% proof stress is less than 60 MPa, the amount of warping of the target after sputtering will increase, and exceed the permissible range. In addition, this kind of increase in the amount of warping is undesirable since it will deteriorate the uniformity of the film thickness during sputtering and also cause the deposition rate to deteriorate. Meanwhile, when the 0.2% proof stress exceeds 200 MPa, this is undesirable since production itself becomes difficult and costs will increase. Preferably, the 0.2% proof stress of the backing plate (copper alloy) is set to 60 to 150 MPa, and more preferably set to 100 to 150 MPa.

In the sputtering target-backing plate assembly of the present invention, a Cu (copper) alloy containing Zn (zinc) is preferably used as the backing plate. A Zn—Cu alloy is preferably used from the perspective of inhibiting the eddy current in magnetron sputtering, and is also superior from the perspective of strength and corrosion resistance. A preferable composition of the Zn—Cu alloy is Zn: 30 to 40 at %, and remainder Cu.

An example of the method of producing the sputtering target-backing plate assembly of the present invention is explained below. Note that the ensuing explanation is provided for facilitating the understanding of the present invention, and is not intended to limit the range of the present invention. In other words, other production methods are also covered by the present invention so as long as they are able to realize the present invention.

Generally speaking, the 0.2% proof stress differs depending on the plastic formation caused by forging, rolling or other processes, particularly based on the heat treatment history, even when the component composition of the materials is the same. Thus, what is particularly important in the present invention is that the conditions of forging, annealing, rolling, heat treatment and other processes are controlled upon performing the processes so that the 0.2% proof stress of the sputtering target and the backing plate falls within a predetermined range.

Upon producing the sputtering target, foremost, a tantalum raw material is subject to electron beam melting and then cast to obtain a tantalum ingot having a diameter of 195 mmφ. The tantalum raw material is preferably a high purity raw material having a high purity in order to prevent the deterioration in the electrical characteristics caused by impurities. For example, a tantalum raw material having a purity of roughly 99.995% can be used. The size of the ingot may be changed as needed in accordance with the intended target size.

Subsequently, the ingot is subject to press forging at room temperature to obtain a diameter of 150 mmφ, and then subject to recrystallization annealing at a temperature of 1100 to 1400° C. The ingot is once again subject to forging at room temperature to obtain a thickness of 100 mm and a diameter of 150 mmφ (primary forging), and subsequently subject to recrystallization annealing at a temperature between the recrystallization temperature and 1400° C. The ingot is once again subject to forging at room temperature to obtain a thickness of 70 to 100 mm and a diameter of 150 to 185 mmφ (secondary forging), and subsequently subject to recrystallization annealing at a temperature between the recrystallization temperature and 1400° C.

The resultant product is thereafter subject to rolling at a rolling reduction of 80 to 90%, and then subject to heat treatment in a vacuum at a temperature of 850 to 950° C. It is thereby possible to obtain a Ta sputtering target having a 0.2% proof stress of 150 to 200 MPa. Note that the degree of forging and the number of times that forging is performed, the rolling reduction, the annealing temperature and the heat treatment temperature described above need to be adjusted as needed since they are affected by the sputtering target size and other factors, and the present invention is not limited to the foregoing production conditions.

Upon producing the backing plate, for example, upset forging of 65 to 70% at 700 to 800° C. is performed to the Zn—Cu alloy billet having a Zn ratio of 34% or 37%. In addition, by molding the resultant product via the spinning process, and performing heat treatment thereto in the atmosphere at a temperature of 300 to 600° C., it is possible to obtain a Cu alloy backing plate having a 0.2% proof stress of 60 to 200 MPa.

The temperature of the upset forging (hot forging) and the degree of forging, and the heat treatment temperature described above need to be adjusted as needed since they are affected by the backing plate size and other factors, and the present invention is not limited to the foregoing production conditions. Moreover, the Zn ratio in the Cu alloy described above is merely an example, and the present invention is not limited to this composition.

EXAMPLES

Examples of the present invention are now explained. Note that these Examples are merely exemplifications and the present invention shall not be limited to these Examples. Specifically, the present invention covers all modes or modifications other than the Examples included in the scope of technical concept of the present invention.

Example 1

A sputtering target having a diameter of 450 mm and a thickness of 13 mm was prepared using tantalum having a 0.2% proof stress of 181.7 MPa. As the backing plate, a Cu alloy having a composition of Zn: 37.0 wt % and remainder Cu and having a 0.2% proof stress of 142.2 MPa was used to prepare a backing plate having a diameter of 540 mm and a thickness of 13 mm. The foregoing sputtering target and backing plate were subject to diffusion bonding to prepare a sputtering target-backing plate assembly. Note that the 0.2% proof stress was measured in compliance with JIS Z2241 (the same applies in the ensuing Examples and Comparative Examples).

Figure 2:
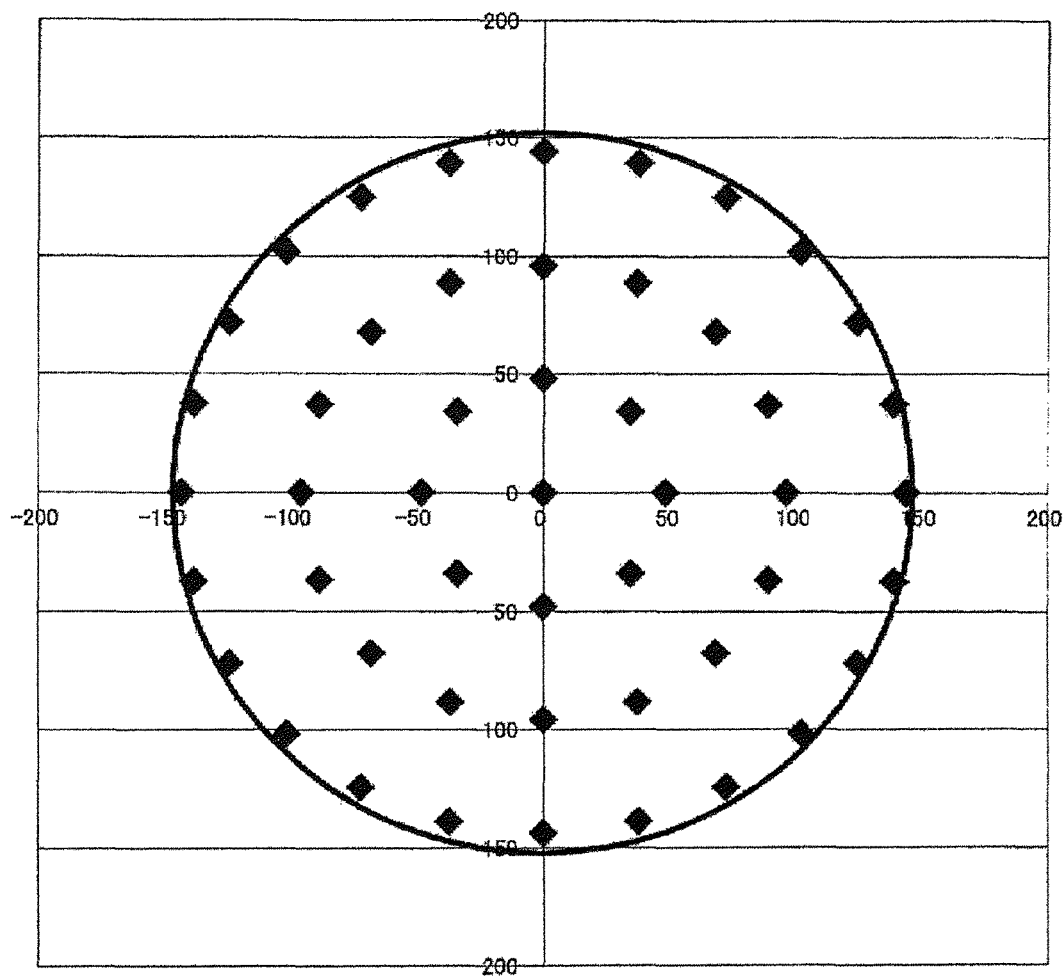
FIG. 2 is a diagram showing the 49 locations in the wafer plane where the sheet resistance of the film was measured.

The obtained sputtering target-backing plate assembly was used to deposit a film on an 8-inch silicon wafer with a magnetron sputtering device based on the following deposition conditions, and the uniformity of the film thickness was measured throughout the target lifetime. In other words, sputtering was performed for each 300 kWh, the average value of the sheet resistance Rs of 49 locations in the plane of the respective wafers shown in FIG. 2, the obtained result was used to calculate the standard deviation of the average value among the wafers, and the in-plane variation (%) of the sputtered film relative to the target lifetime=(standard deviation of sheet resistance among wafers)/(average value of sheet resistance among wafers)×100 was thereby obtained. Consequently, the in-plane variation of the film thickness was 2.0%.

(Deposition Conditions)

Power source: DC system

Power: 15 kW

Ultimate vacuum: $5 \times 10^{-8}$ Torr

Atmosphere gas: Ar

Sputtering gas pressure: $5 \times 10^{-3}$ Torr

Sputtering time: 15 seconds

Subsequently, after performing sputtering up to approximately 1300 kWh in terms of a target lifetime, the sputtering target-backing plate assembly was removed from the sputtering device, and the amount of warping of the target was measured. The warping was defined as the difference in height between the center part and peripheral part of the sputtering surface when a straight gauge is placed on the sputtering surface. In other words, warping=(height of the center part of the sputtering surface)−(height of the peripheral part of the sputtering surface). Consequently, the warping was 0.5 mm. A summary of the foregoing results are shown in Table 1.

TABLE 1

| | Sputtering target (Ta) | | | Backing plate (Cu—Zn alloy) | | | | | |
| --- | --- | --- | --- | --- | --- | --- | --- | --- | --- |
| | 0.2% proof stress (MPa) | Rolling reduction (%) | Vacuum heat treatment temperature after rolling (° C.) | Zn (%) | 0.2% proof stress (MPa) | Atmosphere heat treatment temperature after hot forging (° C.) | In-plane variation of film thickness (%) | Amount of warping after sputtering (mm) | Evaluation |
| Example 1 | 181.7 | 90 | 950 | 37.0 | 142.2 | 300 | 2.0 | 0.5 | ⊚ |
| Example 2 | 177.5 | 85 | 900 | 34.0 | 117.6 | 400 | 2.5 | 0.5 | ⊚ |
| Example 3 | 173.3 | 85 | 900 | 37.0 | 98.0 | 450 | 3.0 | 1.0 | ○ |
| Example 4 | 158.4 | 80 | 850 | 34.0 | 78.4 | 550 | 3.0 | 1.5 | ○ |
| Example 5 | 173.8 | 85 | 900 | 34.0 | 68.6 | 600 | 3.5 | 2.0 | ○ |
| Example 6 | 177.7 | 85 | 900 | 37.0 | 68.6 | 600 | 4.0 | 2.0 | ○ |
| Comparative Example 1 | 162.7 | 70 | 850 | 37.0 | 59.8 | 650 | 4.5 | 3.0 | Δ |
| Comparative Example 2 | 163.8 | 70 | 850 | 34.0 | 57.8 | 650 | 5.0 | 3.0 | Δ |
| Comparative Example 3 | 167.9 | 70 | 850 | 37.0 | 52.0 | 700 | 5.4 | 3.0 | Δ |
| Comparative Example 4 | 165.0 | 70 | 850 | 34.0 | 50.0 | 700 | 6.0 | 3.5 | X |
| Comparative Example 5 | 170.7 | 75 | 900 | 37.0 | 42.2 | 750 | 6.0 | 3.5 | X |
| Comparative Example 6 | 171.0 | 75 | 900 | 34.0 | 39.2 | 750 | 6.5 | 3.5 | X |
| Comparative Example 7 | 148.0 | 65 | 800 | 34 | 140.0 | 300 | 6.6 | 3.9 | X |
| Comparative Example 8 | 145.0 | 65 | 800 | 37 | 40.0 | 750 | 6.9 | 4.5 | X |

Evaluation standard

⊚: In-plane variation of film thickness is 2.5 or less, and amount of warping is 0.5 or less ○: In-plane variation of film thickness is greater than 2.5 and 4.0 or less, and amount of warping is greater than 0.5 and 2.0 or less TABLE 1-continued

| Sputtering target (Ta) | | | Backing plate (Cu—Zn alloy) | | | | | |
|---|---|---|---|---|---|---|---|---|
| 0.2% proof stress (MPa) | Rolling reduction (%) | Vacuum heat treatment temperature after rolling (° C.) | Zn (%) | 0.2% proof stress (MPa) | Atmosphere heat treatment temperature after hot forging (° C.) | In-plane variation of film thickness (%) | Amount of warping after sputtering (mm) | Evaluation |

Δ: In-plane variation of film thickness is greater than 4.0 and 5.5 or less, and amount of warping is greater than 2 and 3.0 or less
X: In-plane variation of film thickness is greater than 5.5, and amount of warping is greater than 3.0

Example 2

A sputtering target having a diameter of 450 mm and a thickness of 13 mm was prepared using tantalum having a 0.2% proof stress of 177.5 MPa. As the backing plate, a Cu alloy having a composition of Zn: 34.0 wt % and remainder Cu and having a 0.2% proof stress of 117.6 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 2.5%. After sputtering, the assembly was removed from the device and the amount of warping of the target was measured, and the result was 0.5 mm.

Example 3

A sputtering target having a diameter of 450 mm and a thickness of 13 mm was prepared using tantalum having a 0.2% proof stress of 173.3 MPa. As the backing plate, a Cu alloy having a composition of Zn: 37.0 wt % and remainder Cu and having a 0.2% proof stress of 98.0 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 3.0%. After sputtering, the assembly was removed from the device and the amount of warping of the target was measured, and the result was 1.0 mm.

Example 4

A sputtering target having a diameter of 450 mm and a thickness of 13 mm was prepared using tantalum having a 0.2% proof stress of 158.4 MPa. As the backing plate, a Cu alloy having a composition of Zn: 34.0 wt % and remainder Cu and having a 0.2% proof stress of 78.4 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 3.0%. After sputtering, the assembly was removed from the device and the amount of warping of the target was measured, and the result was 1.5 mm.

Example 5

A sputtering target having a diameter of 450 mm and a thickness of 13 mm was prepared using tantalum having a 0.2% proof stress of 173.8 MPa. As the backing plate, a Cu alloy having a composition of Zn: 34.0 wt % and remainder Cu and having a 0.2% proof stress of 68.6 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 3.5%. After sputtering, the assembly was removed from the device and the amount of warping of the target was measured, and the result was 2.0 mm.

Example 6

A sputtering target having a diameter of 450 mm and a thickness of 13 mm was prepared using tantalum having a 0.2% proof stress of 177.7 MPa. As the backing plate, a Cu alloy having a composition of Zn: 37.0 wt % and remainder Cu and having a 0.2% proof stress of 68.6 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 4.0%. After sputtering, the assembly was removed from the device and the amount of warping of the target was measured, and the result was 2.0 mm.

Comparative Example 1

A sputtering target having a diameter of 450 mm and a thickness of 13 mm was prepared using tantalum having a 0.2% proof stress of 162.7 MPa. As the backing plate, a Cu alloy having a composition of Zn: 37.0 wt % and remainder Cu and having a 0.2% proof stress of 59.8 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 4.5%. After sputtering, the assembly was removed from the device and the amount of warping of the target was measured, and the result was 3.0 mm.

Comparative Example 2

A sputtering target having a diameter of 450 mm and a thickness of 13 mm was prepared using tantalum having a 0.2% proof stress of 163.8 MPa. As the backing plate, a Cu alloy having a composition of Zn: 34.0 wt % and remainder Cu and having a 0.2% proof stress of 57.8 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 5.0%. After sputtering, the assembly was removed from the device and the amount of warping of the target was measured, and the result was 3.0 mm.

Comparative Example 3

A sputtering target having a diameter of 450 mm and a thickness of 13 mm was prepared using tantalum having a 0.2% proof stress of 167.9 MPa. As the backing plate, a Cu alloy having a composition of Zn: 37.0 wt % and remainder Cu and having a 0.2% proof stress of 52.0 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 5.4%. After sputtering, the assembly was removed from the device and the amount of warping of the target was measured, and the result was 3.0 mm.

Comparative Example 4

A sputtering target having a diameter of 450 mm and a thickness of 13 mm was prepared using tantalum having a 0.2% proof stress of 165.0 MPa. As the backing plate, a Cu alloy having a composition of Zn: 34.0 wt % and remainder Cu and having a 0.2% proof stress of 50.0 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 6.0%. After sputtering, the assembly was removed from the device and the amount of warping of the target was measured, and the result was 3.5 mm.

Comparative Example 5

A sputtering target having a diameter of 450 mm and a thickness of 13 mm was prepared using tantalum having a 0.2% proof stress of 170.7 MPa. As the backing plate, a Cu alloy having a composition of Zn: 37.0 wt % and remainder Cu and having a 0.2% proof stress of 42.2 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 6.0%. After sputtering, the assembly was removed from the device and the amount of warping of the target was measured, and the result was 3.5 mm.

Comparative Example 6

A sputtering target having a diameter of 450 mm and a thickness of 13 mm was prepared using tantalum having a 0.2% proof stress of 171.0 MPa. As the backing plate, a Cu alloy having a composition of Zn: 34.0 wt % and remainder Cu and having a 0.2% proof stress of 39.2 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 6.5%. After sputtering, the assembly was removed from the device and the amount of warping of the target was measured, and the result was 3.5 mm.

Comparative Example 7

A sputtering target having a diameter of 450 mm and a thickness of 13 mm was prepared using tantalum having a 0.2% proof stress of 148.0 MPa. As the backing plate, a Cu alloy having a composition of Zn: 34.0 wt % and remainder Cu and having a 0.2% proof stress of 140.0 MPa was used to prepared a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 6.6%. After sputtering, the assembly was removed from the device and the amount of warping of the target was measured, and the result was 3.9 mm.

Comparative Example 8

A sputtering target having a diameter of 450 mm and a thickness of 13 mm was prepared using tantalum having a 0.2% proof stress of 145.0 MPa. As the backing plate, a Cu alloy having a composition of Zn: 37.0 wt % and remainder Cu and having a 0.2% proof stress of 40.0 MPa was used to prepare a backing plate having a diameter of 540 mm and a thickness of 13 mm. The foregoing sputtering target and backing plate were subject to diffusion bonding to prepare a sputtering target-backing plate assembly.

The obtained sputtering target-backing plate assembly was used to deposit a film based on the same conditions as Example 1, and the uniformity of the film thickness based on the sheet resistance was measured. Consequently, as shown in Table 1, the in-plane variation of the film thickness was 6.9%. After sputtering, the assembly was removed from the device and the amount of warping of the target was measured, and the result was 4.5 mm.

As described above, in all Examples, by using Ta having a 0.2% proof stress of 150 to 200 MPa as the sputtering target, and using a Cu alloy having a 0.2% proof stress of 60 to 200 MPa as the backing plate, it was possible to inhibit the warping of the sputtering target, as well as reduce the in-plane variation of the sputtered film. Accordingly, it was discovered that the combination of the 0.2% proof stress of the sputtering target and the backing plate plays an important role in reducing the warping of the target.

The present invention yields a superior effect of being able to provide a sputtering target-backing plate assembly capable of reducing the warping of the target caused by the heating and cooling that are performed during sputtering process, and consequently capable of increasing the uniformity of the film thickness and increasing the deposition rate. The present invention is particularly effective for use in a magnetron sputtering device.

The invention claimed is:

1. A sputtering target-backing plate assembly consisting of a plate of a sputtering target, a backing plate, and a diffusion bonded interface formed between the sputtering target and the backing plate, wherein the sputtering target consists of a Ta metal having a 0.2% proof stress of 150 to 200 MPa, and the backing plate consists of a Cu—Zn alloy having a thermal expansion coefficient larger than that of the sputtering target and a 0.2% proof stress of 100 to 150 MPa.

2. The sputtering target-backing plate assembly according to claim 1, wherein the Cu—Zn alloy backing plate has a Zn content of 30 to 40 at %.

3. The sputtering target-backing plate assembly according to claim 1, wherein the 0.2% proof stress of the sputtering target is 158.4 to 181.7 MPa.

4. The sputtering target-backing plate assembly according to claim 1, wherein the Cu—Zn alloy backing plate consists of Cu and 30 to 40 at % of Zn.

5. A sputtering target-backing plate assembly consisting of a plate of a sputtering target diffusion bonded to a backing plate, wherein the sputtering target consists of a Ta metal having a 0.2% proof stress of 177.5 to 181.7 MPa, and the backing plate consists of a Cu—Zn alloy having a thermal expansion coefficient larger than that of the sputtering target and a 0.2% proof stress of 117.6 to 142.2 MPa, and wherein the Cu—Zn alloy consist of Cu and 34 to 37 wt % Zn.

6. The sputtering target-backing plate assembly according to claim 1, wherein the Cu—Zn alloy backing plate has a Zn content of 34 to 37 wt % and wherein the 0.2% proof stress of the Cu—Zn alloy backing plate is 117.6 to 142.2 MPa.

* * * * *